US 9,807,886 B2

(12) United States Patent
Park et al.

(10) Patent No.: US 9,807,886 B2
(45) Date of Patent: Oct. 31, 2017

(54) ELECTRONIC CIRCUIT AND METHOD OF FABRICATING THE SAME

(71) Applicant: Electronics and Telecommunications Research Institute, Daejeon (KR)

(72) Inventors: Chan Woo Park, Daejeon (KR); Jae Bon Koo, Daejeon (KR); Sang Chul Lim, Daejeon (KR); Ji-Young Oh, Deajeon (KR); Soon-Won Jung, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 664 days.

(21) Appl. No.: 13/772,288

(22) Filed: Feb. 20, 2013

(65) Prior Publication Data

US 2014/0085840 A1   Mar. 27, 2014

(30) Foreign Application Priority Data

Sep. 24, 2012   (KR) .......................... 10-2012-0105893

(51) Int. Cl.
*H05K 3/34* (2006.01)
*H05K 3/10* (2006.01)
(Continued)

(52) U.S. Cl.
CPC ............. *H05K 3/10* (2013.01); *H05K 1/0283* (2013.01); *H05K 1/0287* (2013.01);
(Continued)

(58) Field of Classification Search
CPC ...... H05K 3/4697; H05K 3/10; H05K 3/0014; H05K 3/284; H05K 1/0283; H05K 1/0287; H05K 1/181
(Continued)

(56) References Cited

U.S. PATENT DOCUMENTS 4,403,272 A * 9/1983 Larson ................. H01H 13/702
361/749
5,090,122 A * 2/1992 Kitagawa ............... H05K 1/095
156/285
(Continued)

FOREIGN PATENT DOCUMENTS

KR   10-0643684 B1   11/2006

OTHER PUBLICATIONS

Dahl-Young Khang et al., "A Stretchable Form of Single-Crystal Silicon for High-Performance Electronics on Rubber Substrates", SCIENCE, Jan. 13, 2006, pp. 209-212, vol. 311.
(Continued)

*Primary Examiner* — Peter DungBa Vo
*Assistant Examiner* — Kaying Kue (57) ABSTRACT

Provided is an electronic circuit including a substrate having a flat device region and a curved interconnection region. A conduction line may extend along an uneven portion in the interconnection region and may be curved. The uneven portion and the conductive line may have a wavy shape. An external force applied to the electronic circuit may be absorbed by the uneven portion and the conductive line. The electronic device may not be affected by the external force. Therefore, functions of the electronic circuit may be maintained. A method of fabricating an electronic circuit according to the present invention may easily adjust areas and positions of the interconnection region and the device region.

15 Claims, 12 Drawing Sheets

(51) Int. Cl.
*H05K 1/02* (2006.01)
*H05K 3/00* (2006.01)
*H05K 1/18* (2006.01)
*H05K 3/28* (2006.01)

(52) U.S. Cl.
CPC .......... *H05K 3/0014* (2013.01); *H05K 1/181* (2013.01); *H05K 3/284* (2013.01)

(58) Field of Classification Search
USPC .......................... 29/846, 841, 832, 848, 849
See application file for complete search history.

(56) References Cited

U.S. PATENT DOCUMENTS

| | | | | |
|---|---|---|---|---|
| 5,095,628 A * | 3/1992 | McKenney | H05K 3/4691 | 156/289 |
| 5,147,208 A * | 9/1992 | Bachler | H01R 12/61 | 29/846 |
| 5,179,460 A * | 1/1993 | Hinata | H01H 13/702 | 200/268 |
| 5,188,984 A * | 2/1993 | Nishiguchi | H01L 21/30608 | 257/777 |
| 5,245,750 A * | 9/1993 | Crumly | H01L 21/4853 | 174/260 |
| 5,288,235 A * | 2/1994 | Sobhani | H01R 12/61 | 174/254 |
| 5,306,670 A * | 4/1994 | Mowatt | H01L 23/5383 | 257/E23.172 |
| 5,331,203 A * | 7/1994 | Wojnarowski | H01L 23/5389 | 257/687 |
| 5,334,279 A * | 8/1994 | Gregoire | B29C 33/3878 | 156/150 |
| 5,364,277 A * | 11/1994 | Crumly | C07J 61/00 | 439/67 |
| 5,560,795 A * | 10/1996 | Bruckner | H05K 3/4084 | 156/182 |
| 5,731,086 A * | 3/1998 | Gebhardt | B29C 43/021 | 428/212 |
| 5,821,615 A * | 10/1998 | Lee | H01L 23/3121 | 257/686 |
| 5,856,641 A * | 1/1999 | Schreiber | H01H 13/702 | 200/1 B |
| 5,924,193 A * | 7/1999 | Crumly | H05K 3/205 | 205/67 |
| 5,928,767 A * | 7/1999 | Gebhardt | B32B 15/08 | 174/258 |
| 5,986,334 A * | 11/1999 | Lee | H01L 23/13 | 257/667 |
| 6,024,580 A * | 2/2000 | Dangler | H01R 12/61 | 439/493 |
| 6,081,997 A * | 7/2000 | Chia | H01L 21/565 | 257/E21.504 |
| 6,246,548 B1 * | 6/2001 | Williams | G11B 5/4846 | 29/840 |
| 6,274,391 B1 * | 8/2001 | Wachtler | H01L 23/055 | 257/E23.062 |
| 6,417,997 B1 * | 7/2002 | Williams | G11B 5/4846 | 29/840 |
| 6,648,675 B2 * | 11/2003 | Welschholz | H01R 12/61 | 439/492 |
| 7,296,345 B1 * | 11/2007 | Wang | B29C 45/1671 | 29/832 |
| 7,329,957 B2 * | 2/2008 | Sakano | H01L 21/4832 | 257/708 |
| 7,408,257 B2 * | 8/2008 | Jung | H01L 23/04 | 257/698 |
| 7,413,975 B2 * | 8/2008 | Otsuki | H01L 21/4857 | 257/676 |
| 7,838,982 B2 * | 11/2010 | Nakamura | H05K 3/4007 | 257/700 |
| 8,033,838 B2 * | 10/2011 | Eldridge | G01R 1/06727 | 439/81 |
| 8,198,621 B2 | 6/2012 | Rogers et al. | | |
| 8,261,437 B2 * | 9/2012 | Yanagimoto | H05K 3/107 | 29/825 |
| 8,530,351 B2 * | 9/2013 | Nakamura | H05K 3/4007 | 257/758 |
| 8,878,162 B2 * | 11/2014 | Bradley | B82Y 10/00 | 257/40 |
| 2003/0143406 A1 * | 7/2003 | Siegel | H01L 21/566 | 428/447 |
| 2004/0135269 A1 * | 7/2004 | Otsuki | H01L 21/4857 | 257/791 |
| 2008/0008824 A1 * | 1/2008 | Cho | H05K 1/09 | 427/98.2 |
| 2008/0012154 A1 * | 1/2008 | Chang | H05K 3/0014 | 257/787 |
| 2008/0012168 A1 * | 1/2008 | Ra | B29C 43/021 | 264/104 |
| 2008/0034581 A1 * | 2/2008 | Ra | H05K 3/0014 | 29/834 |
| 2008/0054518 A1 * | 3/2008 | Ra | B29C 33/3878 | 264/227 |
| 2008/0095985 A1 * | 4/2008 | Frey | H05B 3/84 | 428/156 |
| 2008/0098596 A1 * | 5/2008 | Kim | H05K 3/20 | 29/831 |
| 2008/0180890 A1 * | 7/2008 | Bolis | B81C 1/00333 | 361/824 |
| 2008/0308976 A1 * | 12/2008 | Ito | B32B 18/00 | 264/642 |
| 2010/0270057 A1 * | 10/2010 | Yanagimoto | H05K 3/107 | 174/250 |
| 2010/0288535 A1 * | 11/2010 | Hong | H01L 23/5389 | 174/252 |
| 2010/0327465 A1 * | 12/2010 | Shen | H01L 21/563 | 257/778 |
| 2011/0135248 A1 * | 6/2011 | Langer | G02B 6/138 | 385/14 |
| 2011/0240354 A1 * | 10/2011 | Furuhata | H01L 21/568 | 174/258 |
| 2013/0119652 A1 * | 5/2013 | Stone | B42D 1/007 | 283/72 |
| 2014/0262444 A1 * | 9/2014 | Gregoire | H05K 3/0014 | 174/251 |
| 2016/0165733 A1 * | 6/2016 | Kim | H05K 1/186 | 174/260 |

OTHER PUBLICATIONS

Yugang Sun. et al., "Controlled buckling of semiconductor nanoribbons for stretchable electronics", Nature Nanotechnology, Dec. 2006, pp. 201-207, vol. 1, Nature Publishing Group.

Won Mook Choi et al., "Biaxially Stretchable "Wavy" Silicon Nanomembranes", Nano Letters, 2007, pp. 1655-1663, vol. 7 No. 6, American Chemical Society.

Kyungyea Park et al., "Stretchable, Transparent Zinc Oxide Thin Film Transistors", Advanced Functional Materials, 2010, pp. 3577-3582, vol. 20, WILEY-VCH Verlag GmbH & Co.

Ali Asgar S. Bhagat et al., "Photodefinable polydimethylsiloxane (PDMS) for rapid lab-on-a-chip prototyping", Lab on a Chip, 2007, pp. 1192-1197, vol. 7, The Royal Society of Chemistry.

Dae-Hyeong Kim et al., "Materials and noncoplanar mesh designs for integrated circuits with linear elastic responses to extreme mechanical deformations", PNAS, Dec. 2, 2008, pp. 18675-18680, vol. 105, No. 48.

Dae-Hyeong Kim et al., "Stretchable and Foldable Silicon Integrated Circuits", Science, Apr. 25, 2008, pp. 507-511, vol. 320.

Tsuyoshi Sekitani et al., "A Rubberlike Stretchable Active Matrix Using Elastic Conductors", SCIENCE, Sep. 12, 2008, pp. 1468-1472, vol. 321.

Office Action for U.S. Appl. No. 14/089,378 dated Sep. 18, 2015.
Office Action for U.S. Appl. No. 14/244,087 dated Sep. 16, 2015.

* cited by examiner

ELECTRONIC CIRCUIT AND METHOD OF FABRICATING THE SAME

CROSS-REFERENCE TO RELATED APPLICATIONS

This U.S. non-provisional patent application claims priority under 35 U.S.C. §119 of Korean Patent Application No. 10-2012-0105893, filed on Sep. 24, 2012, the entire contents of which are hereby incorporated by reference.

BACKGROUND

The present invention disclosed herein relates to an electronic circuit and a method of fabricating the same, and more particularly, to a stretchable electronic circuit and a method of fabricating the same.

Recently, importance of stretchable electronic circuits has been increased along with the development of multimedia. Stretchable electronic circuits may be used in various fields such as sensor skin for robots, wearable communication devices, implantable or wearable biodevices, and/or advanced displays. Therefore, there is a need to fabricate organic light emitting displays (OLEDs), liquid crystal displays (LCDs), electrophoretic displays (EPDs), plasma display panels (PDPs), thin-film transistors (TFTs), microprocessors, and random access memories (RAMs) on stretchable substrates. Stretchable electronic circuits must maintain electrical functions even in the case that a substrate expands or contracts due to an external force.

SUMMARY

The present invention provides an electronic circuit maintaining circuit functions while accommodating an external force.

The present invention also provides a method of fabricating an electronic circuit applicable to large-area devices as well as having reliability.

The object of the present invention is not limited to the aforesaid, but other objects not described herein will be clearly understood by those skilled in the art from descriptions below.

Embodiments of the present invention provide electronic circuits including: a substrate including a device region and an interconnection region; an electronic device disposed on the device region; a conductive line disposed on the interconnection region to electrically connect the electronic devices; and a capping layer on the substrate, wherein the device region may be flat; and wherein the interconnection region may have an uneven portion.

In some embodiments, the uneven portion may include a concave portion and a convex portion; and wherein the concave portion and the convex portion may have a round shape.

In other embodiments, the concave portion may have a height equal to or lower than that of the device region and the convex portion may have a height higher than that of the concave portion.

In still other embodiments, the conductive line may extend along the uneven portion and may have a wavy curve.

In even other embodiments, the uneven portion may have a wavy shape in which a wave propagates in one direction, a wavy shape in which a wave propagates in one direction and the other direction perpendicular to the one direction, a wavy shape in which a wave propagates in a zigzag direction, or a wavy shape in which a wave propagates in an irregular direction.

In yet other embodiments, the substrate and the capping layer may include an elastic polymer material.

In other embodiments of the present invention, methods of fabricating an electronic circuit including: providing a substrate including an interconnection region and a device region; forming a conductive line in the interconnection region and forming an electronic device in the device region; and forming a capping layer on the substrate, wherein the interconnection region may have an uneven portion, and wherein the device region may be flat.

In some embodiments, the providing of the substrate may include: providing a mother substrate coated with a photoresist layer including a first region and a second region; forming a wavy pattern in the first region by using a grayscale photomask; coating the photoresist layer with an elastic polymer to form the substrate; and separating the substrate from the mother substrate and the photoresist layer.

In other embodiments, the first region may have a position corresponding to the interconnection region of the substrate and an inverted structure of the interconnection region of the substrate, and wherein the second region may have a position corresponding to the device region of the substrate and an inverted structure of the device region of the substrate.

In still other embodiments, the providing of the substrate may include: coating a mother substrate with an elastic polymer including a photoinitiator to form the substrate; and forming the uneven portion by using a grayscale photomask.

In even other embodiments, the method may further include separating the substrate from the mother substrate, after forming the capping layer.

In yet other embodiments, the forming of the uneven portion may include forming a wavy curve in the interconnection region by patterning the substrate.

In further embodiments, the providing of the substrate may include: forming a photoresist layer including a first region and a second region on a mother substrate; forming a square pattern in the first region; forming a round pattern by reflowing the photoresist layer; coating the photoresist layer with an elastic polymer to form the substrate; and separating the substrate from the mother substrate and the photoresist layer.

In still further embodiments, the forming of the round pattern may include forming a pattern having a structure inverted from the uneven portion In still other embodiments of the present invention, methods of fabricating an electronic circuit including: forming a photoresist layer including a first region and a second region on a mother substrate; forming a curved portion having a wavy shape in the first region; coating the photoresist layer with an elastic polymer to form a substrate including an interconnection region having an uneven portion and a flat device region; forming a conductive line in the interconnection region of the substrate and forming an electronic device in the device region of the substrate; forming a capping layer on the substrate; and separating the substrate from the photoresist layer.

In some embodiments, the uneven portion may extend along the curved portion.

In other embodiments, the forming of the curved portion may include: forming a square pattern in the first region; and forming a round pattern by reflowing the photoresist layer.

In still other embodiments, the forming of the curved portion may include forming a pattern having the wavy shape in the first region by using a grayscale photomask.

In even other embodiments, the method may further include forming an auxiliary substrate spaced apart from and facing the capping layer, after separating the substrate.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE EMBODIMENTS

Preferred embodiments of the present invention will be described with reference to the accompanying drawings to fully understand the constitution and effect of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. It will be understood by those of ordinary skill in the art that the concepts of the present invention may be implemented in any appropriate environment.

In the following description, the technical terms are used only for explaining a specific exemplary embodiment while not limiting the present invention. The terms of a singular form may include plural forms unless referred to the contrary.

The meaning of "comprises" and/or "comprising" specifies a property, a region, a fixed number, a step, a process, an element and/or a component but does not exclude other properties, regions, fixed numbers, steps, processes, elements and/or components.

In the specification, it will be understood that when a layer (or film) is referred to as being 'on' another layer or substrate, it can be directly on the other layer or substrate, or intervening layers may also be present.

Also, though terms like a first, a second, and a third are used to describe various regions and layers in various embodiments of the present invention, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. In the drawings, like reference numerals refer to like elements throughout.

Unless otherwise defined, all terms used in the embodiments of the present invention have meanings understood by those skilled in the art.

Hereinafter, an electronic circuit according to the present invention will be described with reference to the accompanying drawings.

Figure 1:
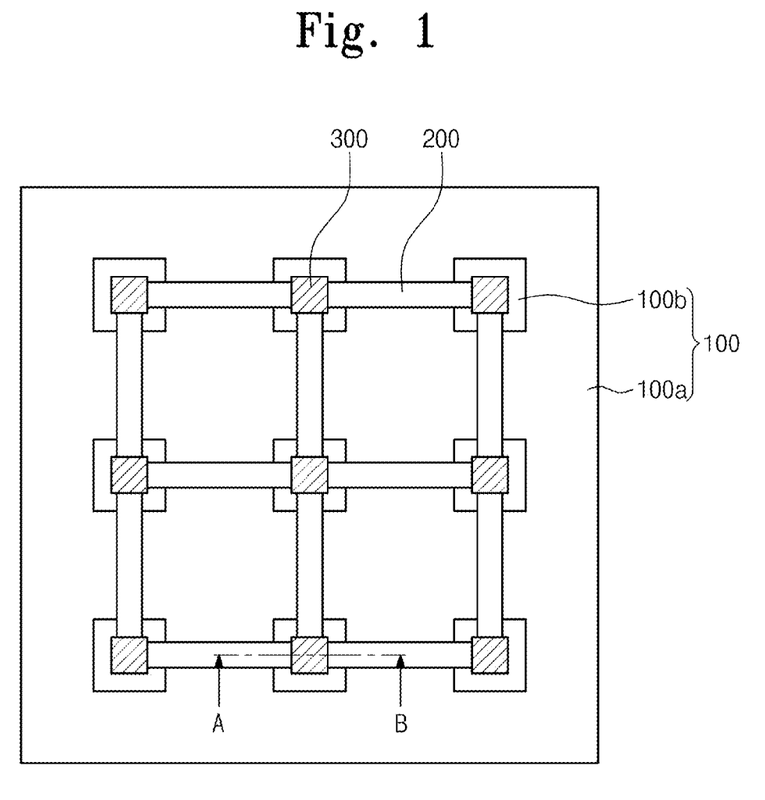
FIG. 1 is a plan view illustrating an electronic circuit according to an embodiment of the present invention.
Figure 2:
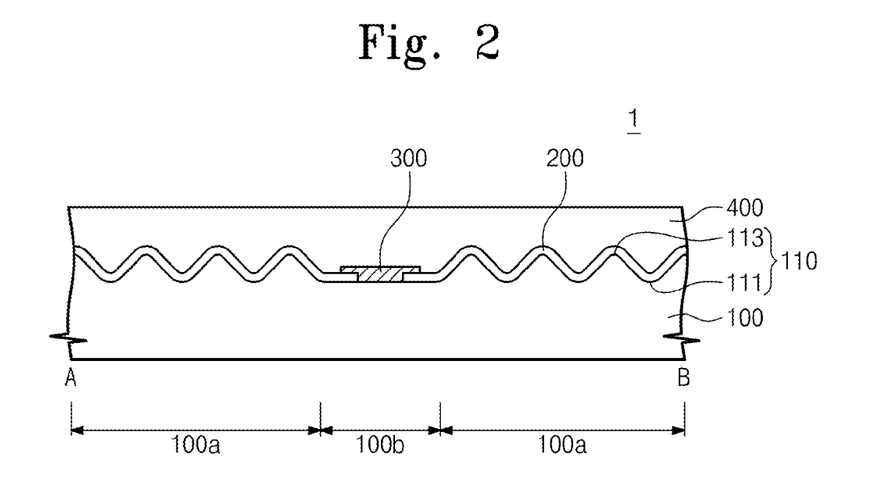
FIG. 2 is a cross-sectional view taken along line A-B of FIG. 1.

FIG. 1 is a plan view illustrating an electronic circuit according to an embodiment of the present invention. FIG. 2 is a cross-sectional view taken along line A-B of FIG. 1.

Referring to FIGS. 1 and 2, an electronic circuit 1 may include a conductive line 200, an electronic device 300, and a capping layer 400 on a substrate 100.

The substrate 100 may include an elastic polymer material. For example, the substrate 100 may include polydimethylsiloxane (PDMS). The substrate 100 may include an interconnection region 100a and a device region 100b. The device region 100b may be flat. An uneven portion 110 may be provided in the interconnection region 100a. The uneven portion 110 may include a concave portion 111 and a convex portion 113. The concave portion 111 may have a height equal to or lower than that of the device region 100b. The convex portion 113 may have a height higher than that of the concave portion 111. The concave portion 111 and the convex portion 113 may have a round shape. For example, the uneven portion 110 may have a wavy shape.

FIGS. 3A through 3D are perspective views illustrating uneven portions according to embodiments of the present invention. Hereinafter, the present invention will be described with reference to FIGS. 3A through 3D along with FIGS. 1 and 2.

Figure 3A:
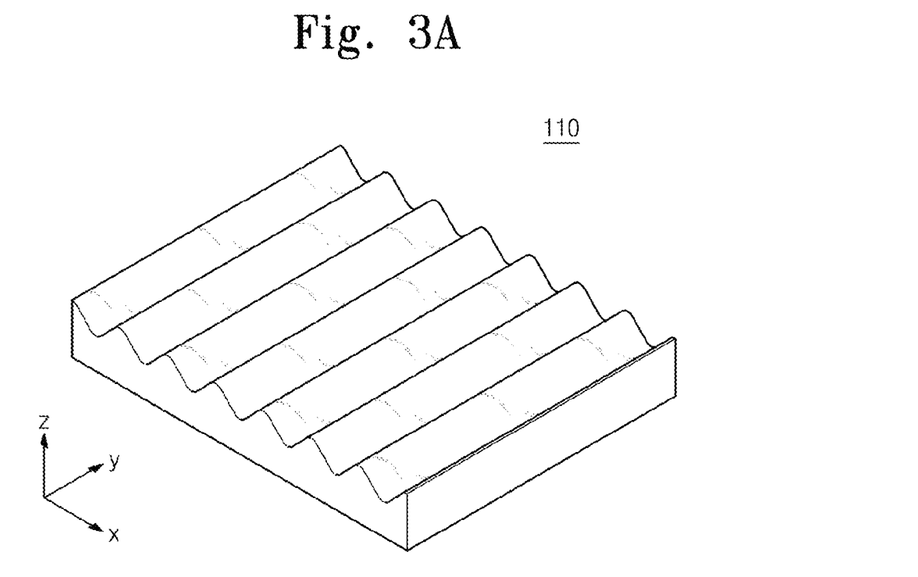
FIGS. 3A through 3D are perspective views illustrating uneven portions according to embodiments of the present invention.

Referring to FIG. 3A, the uneven portion 110 may have a wavy shape in which a wave propagates in an x-axis direction. For example, a cross section of the uneven portion 110 along the x-axis may be curved, and a cross section and a plane of the uneven portion 110 along a y-axis may have a linear shape.

Figure 3B:
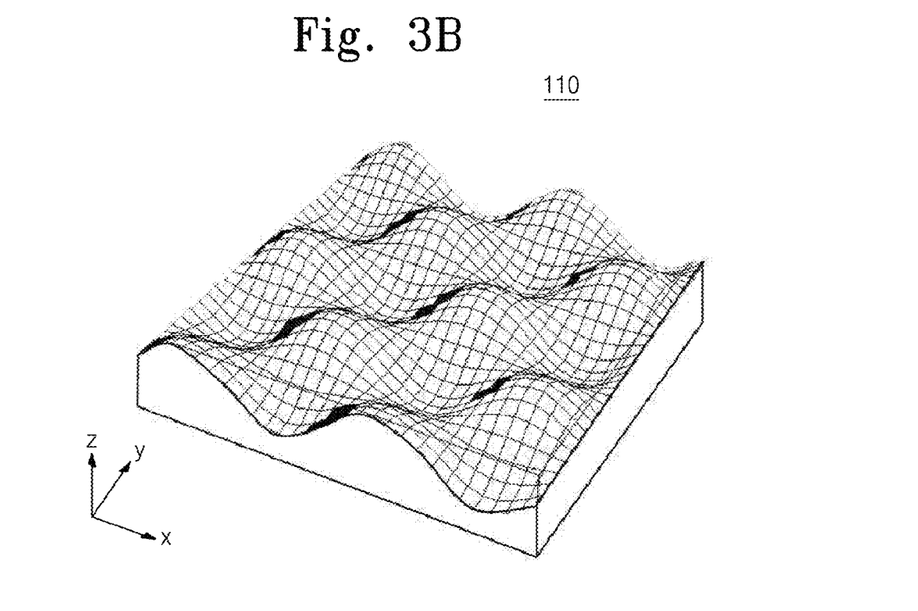

Referring to FIG. 3B, the uneven portion 110 may have a wavy shape in which a wave propagates in the x-axis and y-axis directions. For example, cross sections of the uneven portion 110 along the x-axis and the y-axis may be curved.

Figure 3C:
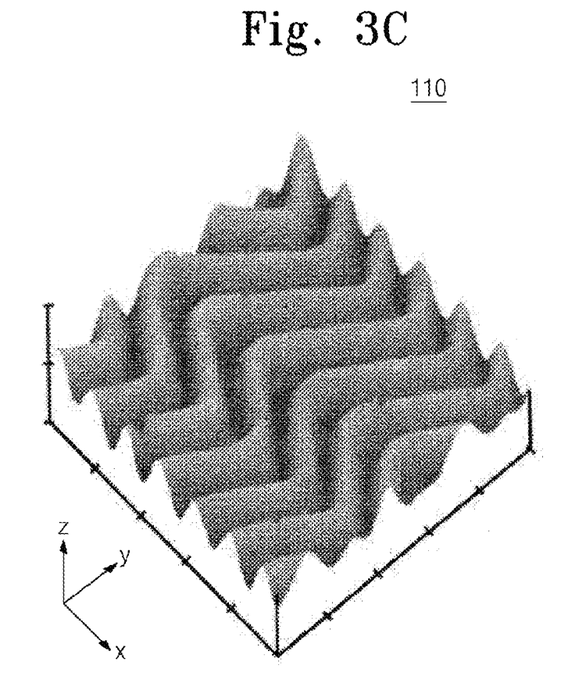

Referring to FIG. 3C, the uneven portion 110 may have a wavy shape in which a wave propagates in a zigzag direction. For example, a cross section of the uneven portion 110 along the x-axis, a cross section of the uneven portion 110 along the y-axis, and a plane (a cross section along a z-axis) of the uneven portion 110 may be curved.

Figure 3D:
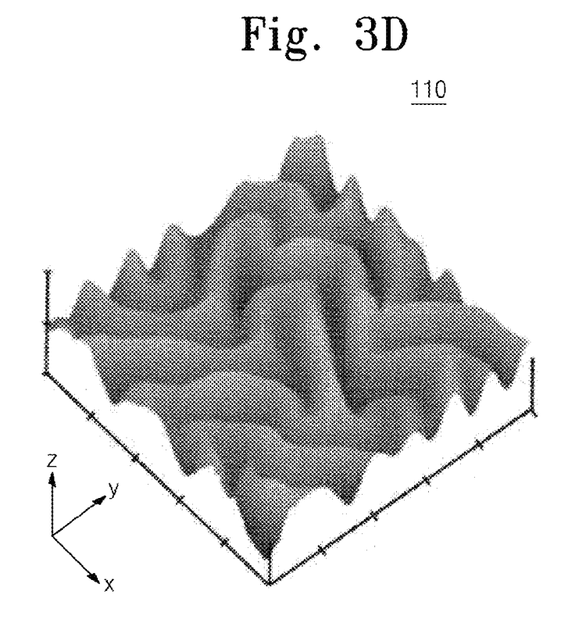

Referring to FIG. 3D, the uneven portion 110 may have a wavy shape in which a wave propagates in an irregular direction. For example, a cross section of the uneven portion 110 along the x-axis, a cross section of the uneven portion 110 along the y-axis, and/or a plane of the uneven portion 110 may be irregularly curved.

Referring again to FIGS. 1 and 2, the conductive line 200 may be provided in the interconnection region 100a of the substrate 100. The conductive line 200 may have a pattern on the substrate 100. The conductive line 200 may extend and curved along the uneven portion 110 of the substrate 100. For example, the conductive line 200 may have the wavy shapes as illustrated in FIGS. 3A to 3D. The conductive line 200 may extend to a portion of the device region 100b. The conductive line 200 may be in contact with the electronic device 300. The conductive line 200 may be disposed between the electronic devices 300 to electrically connect the electronic devices 300. The conductive line 200 may include a conductive material. For example, the conductive line 200 may include at least one of aluminum, gold, silver, copper, tungsten, impurity-doped polysilicon, and/or an alloy therebetween.

The electronic device 300 may be provided in the device region 100*b* of the substrate 100. The electronic device 300 may include at least one of a semiconductor device, an organic light emitting display (OLED), a liquid crystal display (LCD), an electrophoretic display (EPD), a plasma display panel (PDP), a thin-film transistor (TFT), a microprocessor, and/or a random access memory (RAM).

The capping layer 400 may be provided on the substrate 100. The capping layer 400 may cover the conductive line 200 and/or the electronic device 300. The capping layer 400 may protect the conductive line 200 and/or the electronic device 300. The capping layer 400 may include an elastic polymer material, for example, polydimethylsiloxane (PDMS).

An external force may be applied to the electronic circuit 1. The uneven portion 110 of the substrate 100 and/or the conductive line 200 have wavy curves, and thus, may absorb impact. The applied external force may be absorbed by the substrate 100 and/or the conductive line 200. The force applied to the electronic circuit 1 may be dispersed through the capping layer 400 as well as the substrate 100. The conductive line 200 may maintain electrical connection between the electronic devices 300 in spite of external impact. The electronic device 300 may not be affected by the external force by being disposed on the flat device region 100*b*. Therefore, functions of the electronic circuit 1 may be maintained.

Methods of fabricating an electronic circuit according to embodiments of the present invention will be described below. Hereinafter, for the simplicity of the description, the description overlapping with those of FIGS. 1 through 3D will be omitted.

<Preparation Example 1 of Photoresist Mold>

Figure 4:
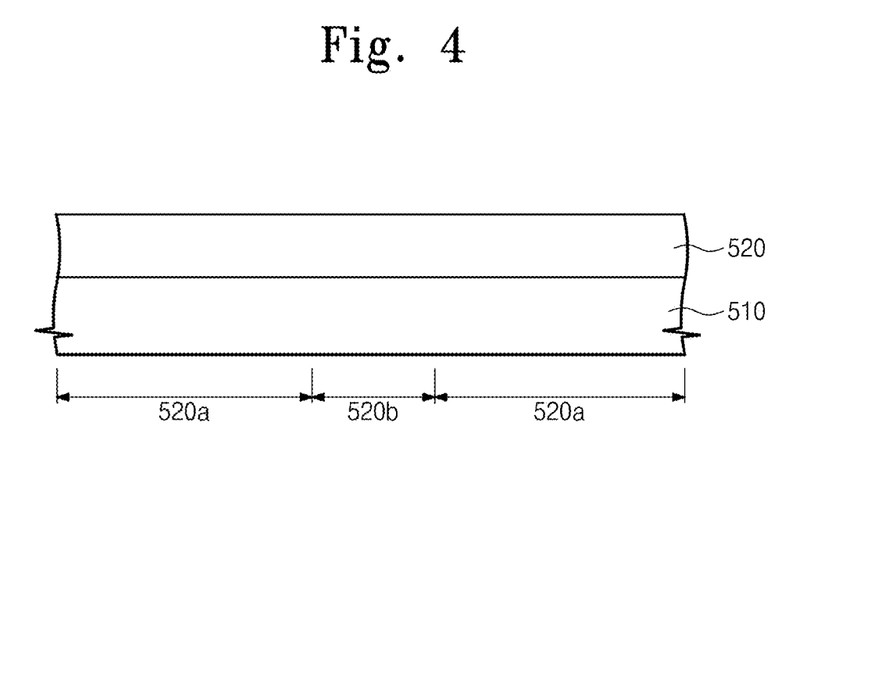
FIGS. 4 through 6 are cross-sectional views illustrating an example of a method of preparing a photoresist mold.
Figure 5:
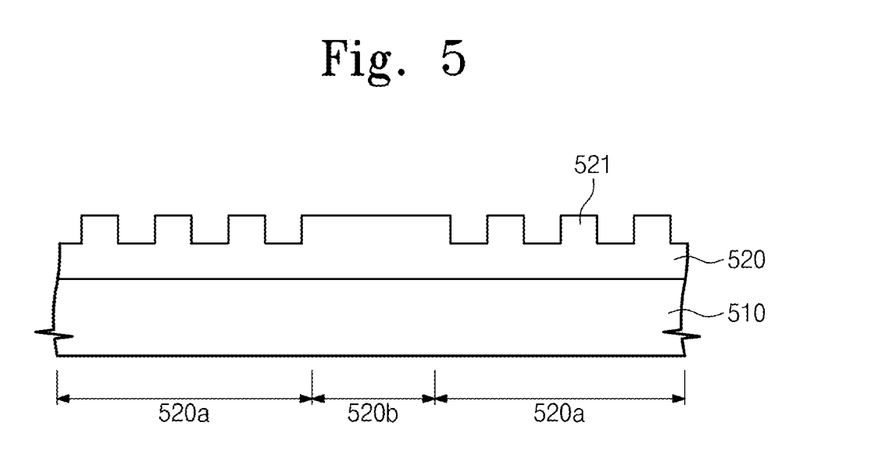
Figure 6:
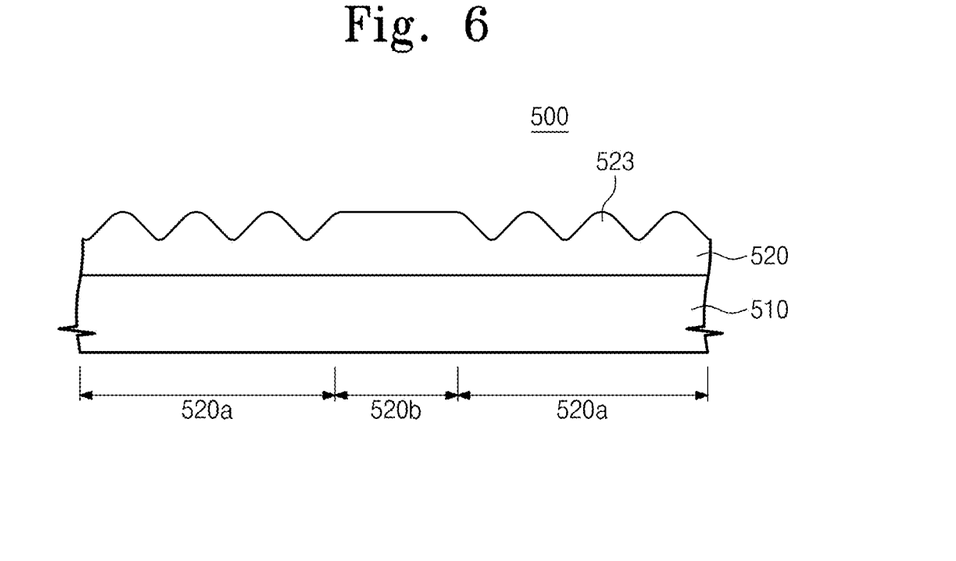

FIGS. 4 through 6 are cross-sectional views illustrating an example of a method of preparing a photoresist mold.

Referring to FIG. 4, a mother substrate 510 including a photoresist layer 520 is provided. The mother substrate 510 may include at least one of silicon, glass, plastic, indium tin oxide (ITO), and/or fluorine-doped tin oxide (FTO). The mother substrate 510 may be coated with the photoresist layer 520. The photoresist layer 520 may be formed to include a first region 520*a* and a second region 520*b*. The first region 520*a* may have a position corresponding to the interconnection region 100*a* of the substrate 100 illustrated in FIG. 1. The second region 520*b* may have a position and a structure (e.g., flat structure) corresponding to the device region 100*b* of the substrate 100.

Referring to FIG. 5, a pattern 521 may be formed in the photoresist layer 520 by a photolithography process. The pattern 521 may be formed in the first region 520*a*. The pattern 521 may not be formed in the second region 520*b*. The pattern 521 may be formed to have a square shape.

Referring to FIG. 6, a curved portion 523 may be formed in the photoresist layer 520. The curved portion 523 may be formed by a reflow process. A square pattern (see 521 in FIG. 5) may be changed into the round curved portion 523. The reflow process may be performed above a glass transition temperature of the photoresist layer 520. The curved portion 523 may be formed to have a structure corresponding to the uneven portion 110 of the substrate 100 illustrated in FIG. 1. For example, the curved portion 523 may have a structure inverted from the uneven portion 110 of the substrate 100. The curved portion 523 may have the wavy shapes as illustrated in FIGS. 3A through 3D.

A photoresist mold 500 including the mother substrate 510 and the photoresist layer 520 having the curved portion 523 may be completed according to the foregoing example of the preparation method.

<Preparation Example 2 of Photoresist Mold>

Figure 7:
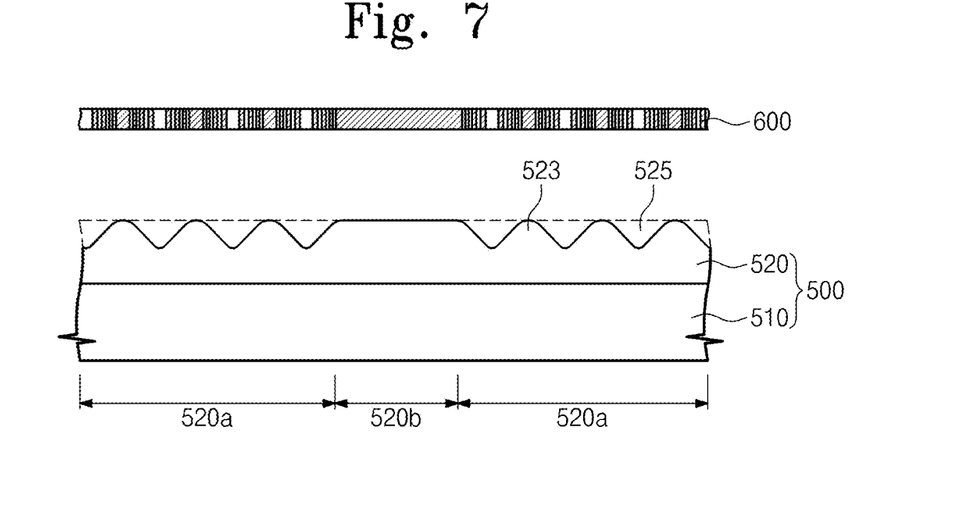
FIG. 7 is a cross-sectional view illustrating another example of the method of preparing a photoresist mold.

FIG. 7 is a cross-sectional view illustrating another example of the method of preparing a photoresist mold.

Referring again to FIG. 4, the mother substrate 510 including the photoresist layer 520 is provided. This may be identical or similar to the foregoing description.

Referring to FIG. 7, a curved portion 523 may be formed in the photoresist layer 520. The curved portion 523 may have the wavy shapes as illustrated in FIGS. 3A through 3D. The curved portion 523 may be formed in the first region 520*a*. Patterning may be performed by grayscale lithography using a grayscale photomask 600 that may adjust an amount of transmitted light. When the light is transmitted through the grayscale photomask 600, a degree of exposure of the photoresist layer 520 may be changed according to the amount of the transmitted light. As a result, an amount of the photoresist layer 525 removed during development may be changed. The photoresist layer 520 may include a first region 520*a* and a second region 520*b*. The second region 520*b* may not be exposed to light. The first region 520*a* may be exposed to light while periodically changing a progressing direction of light, transmittance of light, and/or intensity of light. A shape of the curved portion 523 may be controlled. For example, a wavy shape of the curved portion 523 may be formed by controlling an amplitude, a period, and/or directionality.

A photoresist mold 500 including the mother substrate 510 and the photoresist layer 520 having the curved portion 523 may be completed according to the foregoing another example of the preparation method.

<Example 1 of Method of Fabricating Electronic Circuit>

FIGS. 8 through 11 are cross-sectional views illustrating a method of fabricating an electronic circuit according to an embodiment of the present invention.

Figure 8:
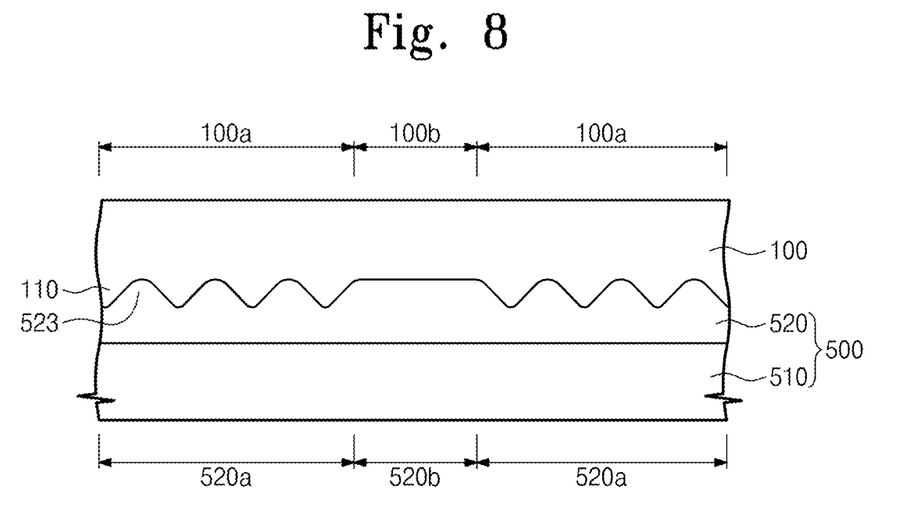
FIGS. 8 through 11 are cross-sectional views illustrating an example of a method of fabricating an electronic circuit.

Referring to FIG. 8, a substrate 100 may be formed on a photoresist mold 500. The photoresist mold 500 may be formed as in the example of FIGS. 4 to 6 or as in the example of FIG. 7. The photoresist mold 500 may be coated with an elastic polymer and the substrate 100 may be formed by solidifying the elastic polymer. The substrate 100 may include polydimethylsiloxane (PDMS). An uneven portion 110 may be formed in an interconnection region 100*a* of the substrate 100. The uneven portion 110 may be formed to have a structure (e.g., inverted structure) corresponding to a curved portion 523 of a photoresist layer 520.

Figure 9:
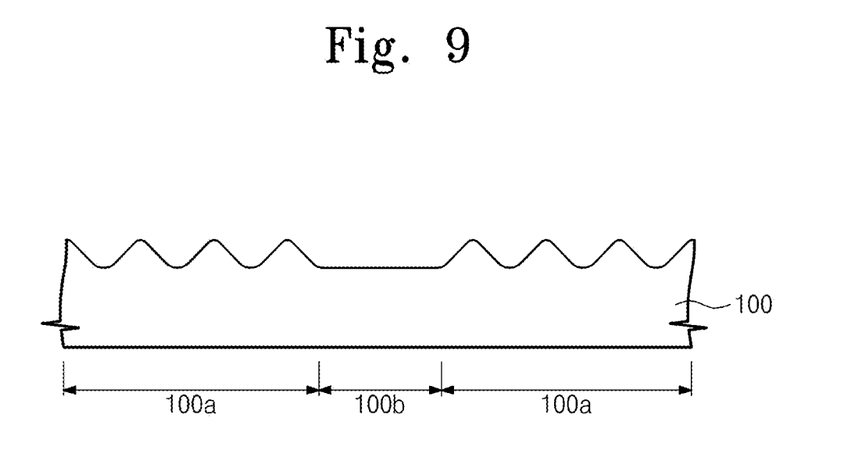

Referring to FIG. 9, the substrate 100 may be separated. The substrate 100 may be separated from the photoresist mold 500 and then inverted.

Figure 10:
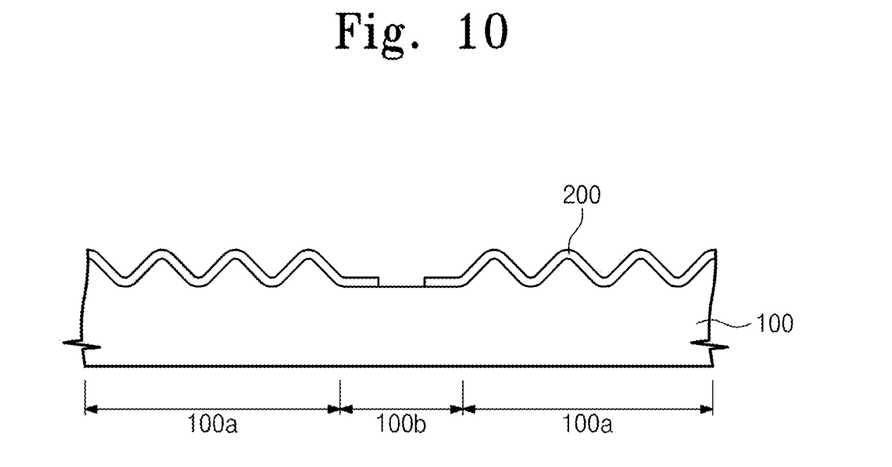

Referring to FIG. 10, a conductive line 200 may be formed in the interconnection region 100*a* of the substrate 100. The conductive line 200 may also be formed in a portion of a device region 100*b*. For example, the conductive line 200 may be formed by using a photolithography process and an etching process. As another example, the conductive line 200 may be formed by using a photolithography process and a lift-off process. As another example, the conductive line 200 may be formed by using a shadow deposition process. As another example, the conductive line 200 may be formed by using a printing process.

Figure 11:
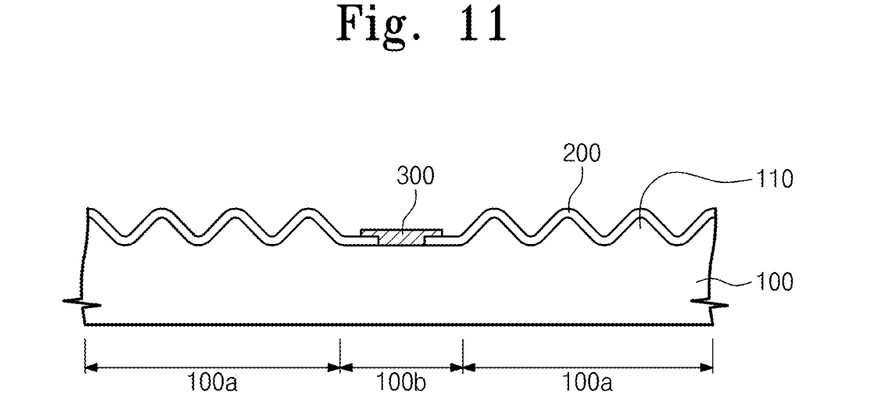

Referring to FIG. 11, an electronic device 300 may be formed in the device region 100b of the substrate 100. A process of forming the electronic device 300 may include at least one of a photolithography process, an etching process, a shadow deposition process, a transfer process, and/or a printing process. The process of forming the electronic device 300 may be performed before the formation of the conductive line 200.

Referring again to FIG. 2, the capping layer 400 may be formed on the substrate 100. The capping layer 400 may be formed to cover the conductive line 200 and the electronic device 300. An elastic polymer material, for example, polydimethylsiloxane (PDMS) is coated and the capping layer 400 may then be formed by solidifying the elastic polymer material.

<Example 2 of Method of Fabricating Electronic Circuit>

FIGS. 12 through 16 are cross-sectional views illustrating another example of the method of fabricating an electronic circuit. Hereinafter, the description overlapping with the foregoing description will be omitted.

Figure 12:
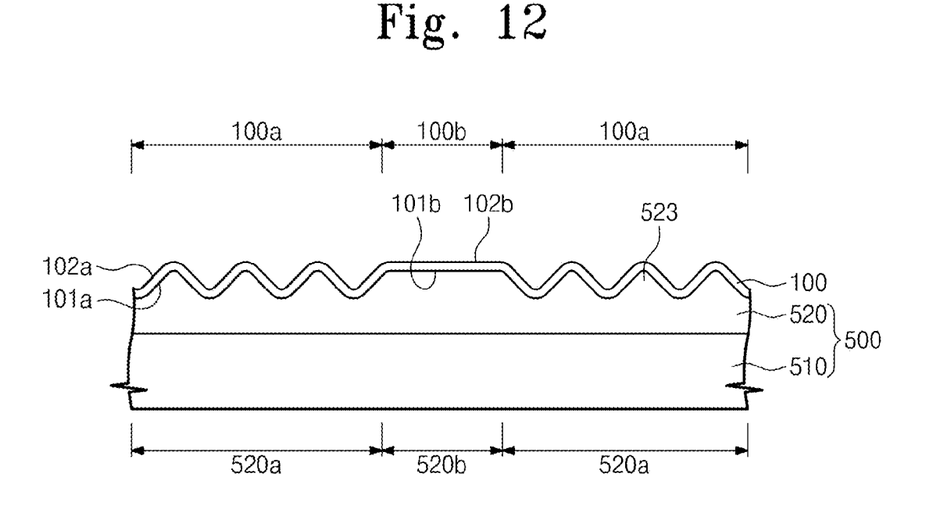
FIGS. 12 through 16 are cross-sectional views illustrating another example of the method of fabricating an electronic circuit.

Referring to FIG. 12, a substrate 100 may be formed on a photoresist mold 500. The photoresist mold 500 may be formed as in the example of FIGS. 4 to 6 or as in the example of FIG. 7. A photoresist layer 520 may be coated with an elastic polymer, such as PDMS, by spin coating and the elastic polymer may then be solidified. The substrate 100 may be formed to have a position and a structure corresponding to the photoresist layer 520. For example, the substrate 100 in a device region 100b may have a flat upper surface 102b and a flat lower surface 101b. The substrate 100 in an interconnection region 100a may have a wavy upper surface 102a and a wavy lower surface 101a which extend along a curved portion 523.

Figure 13:
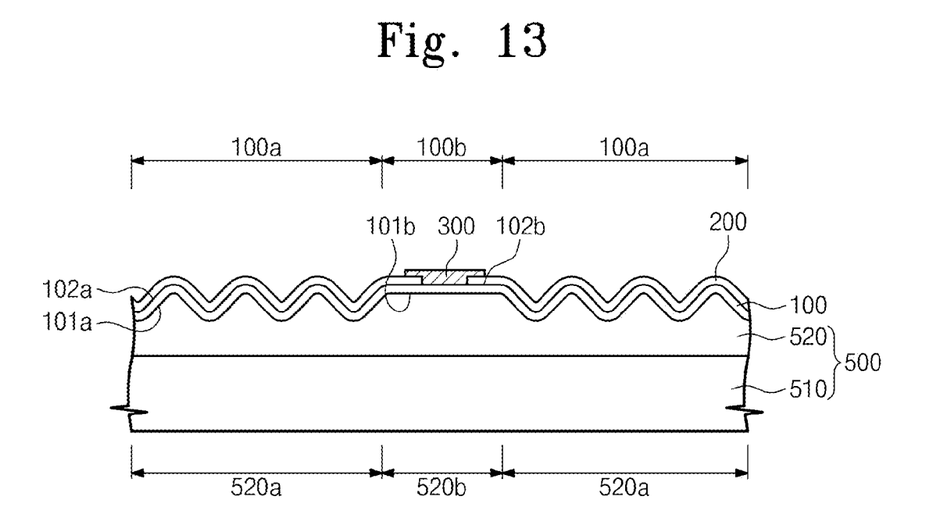

Referring to FIG. 13, a conductive line 200 and an electronic device 300 may be formed on the substrate 100. The conductive line 200 may be formed in the interconnection region 100a of the substrate 100. The electronic device 300 may be formed in the device region 100b of the substrate 100.

Figure 14:
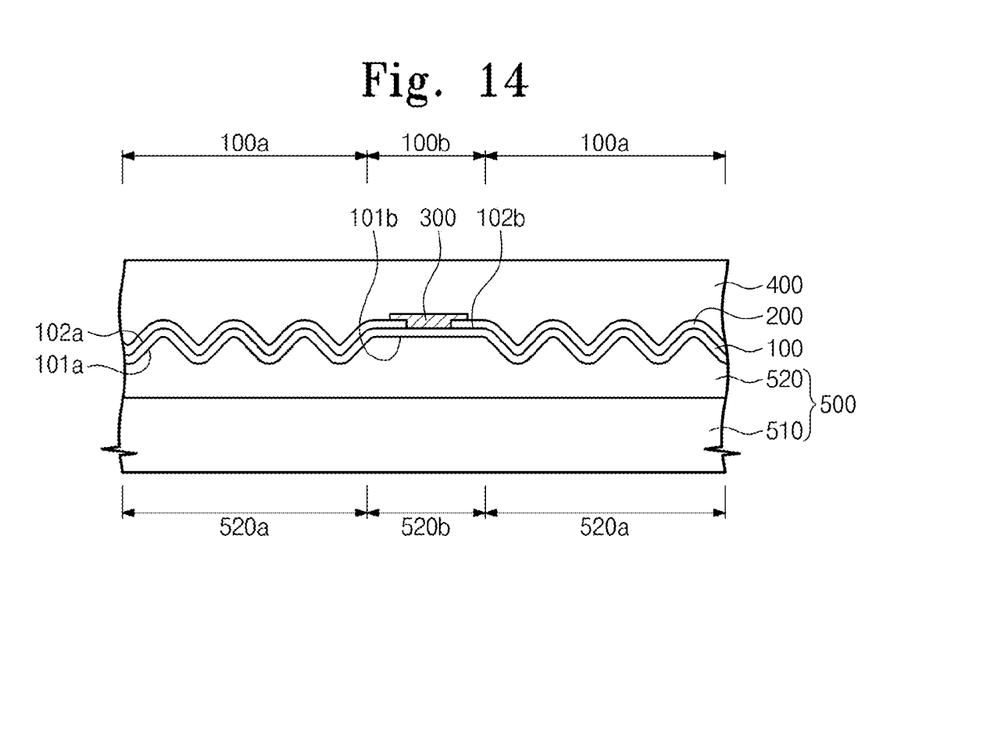

Referring to FIG. 14, a capping layer 400 may be formed on the substrate 100. The substrate 100 is coated with PDMS and the capping layer 400 may then be formed by solidifying PDMS.

Figure 15:
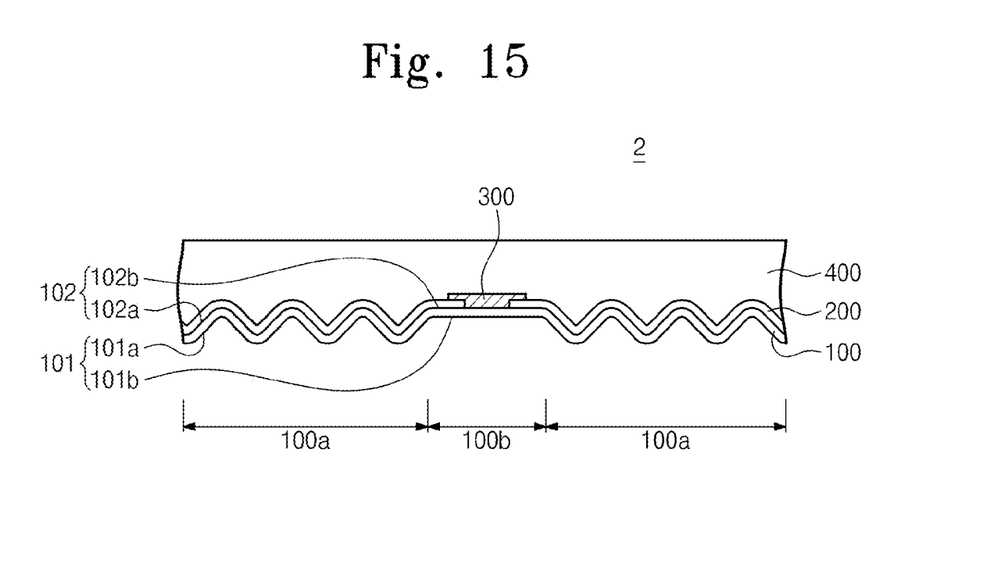

Referring to FIG. 15, the substrate 100 may be separated from the photoresist mold 500. A lower surface 101 of the substrate 100 is exposed and an electronic circuit 2 may be formed.

Figure 16:
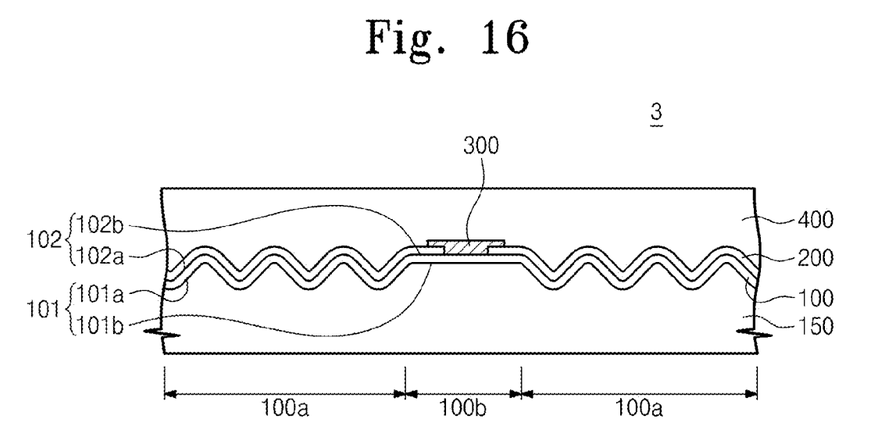

Referring to FIG. 16, an auxiliary substrate 150 may be formed to be in contact with the exposed lower surface 101 of the substrate 100. The auxiliary substrate 150 may be spaced apart from and face the capping layer 400. The auxiliary substrate 150 may include a material identical or similar to that of the substrate 100. The formation of the auxiliary substrate 150 may be omitted.

An electronic circuit 3 of the present invention may be completed according to the foregoing example of the method of fabricating an electronic circuit.

<Example 3 of Method of Fabricating Electronic Circuit>

FIGS. 17 through 20 are cross-sectional views illustrating another example of the method of fabricating an electronic circuit. Hereinafter, the description overlapping with the foregoing description will be omitted.

Figure 17:
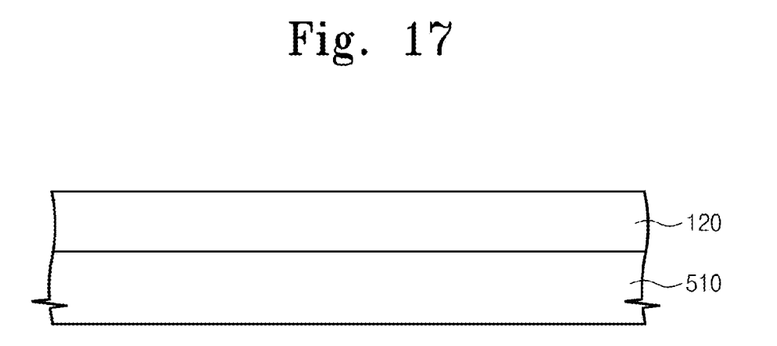
FIGS. 17 through 20 are cross-sectional views illustrating another example of the method of fabricating an electronic circuit.

Referring to FIG. 17, a mother substrate 510 including an elastic polymer layer 120 may be prepared. The elastic polymer layer 120 may include PDMS that may be photopatterned. A photoinitiator, such as 2,2-dimethoxy-2-phenyl acetophenone (DMAP), and PDMS are mixed, and the elastic polymer layer 120 may then be prepared by coating the mother substrate 510 therewith.

Figure 18:
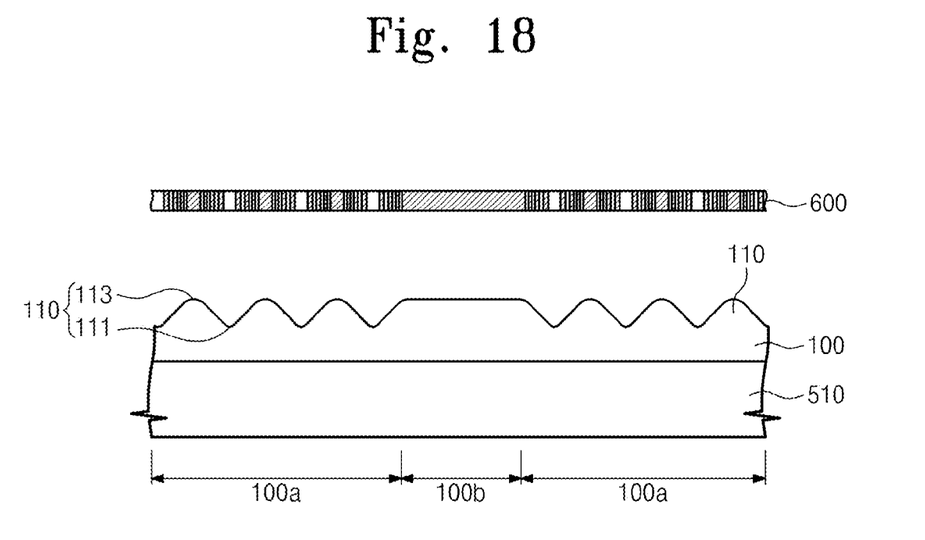

Referring to FIG. 18, a substrate 100 may be formed by patterning the elastic polymer layer (see 120 in FIG. 17). Patterning may be performed by grayscale lithography. When the light is transmitted through a grayscale photomask 600, a degree of exposure of the elastic polymer layer (see 120 in FIG. 17) may be changed according to the amount of the transmitted light. An uneven portion 110 may include a concave portion 111 and a convex portion 113. The concave portion 111 may have a height equal to or lower than that of the device region 100b. The convex portion 113 may be formed to have a height higher than that of the concave portion 111.

Figure 19:
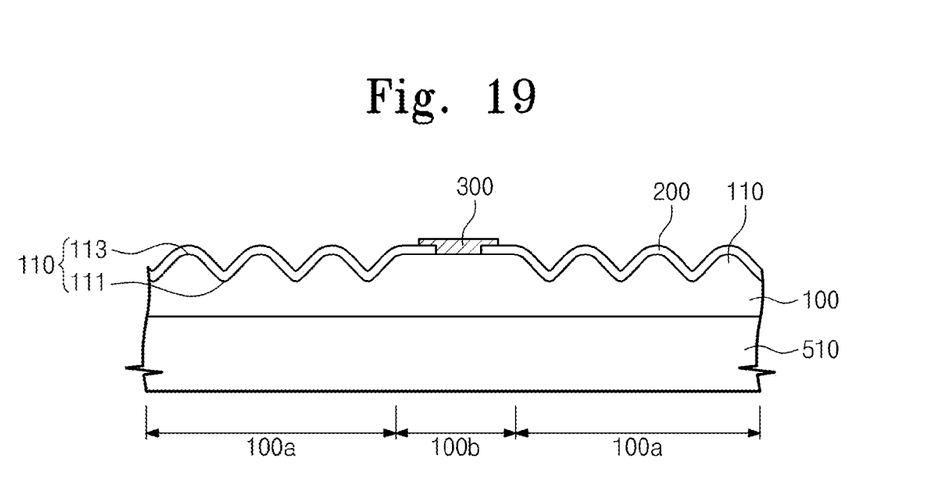

Referring to FIG. 19, a conductive line 200 and an electronic device 300 may be formed on the substrate 100. The conductive line 200 and the electronic device 300 may be formed as in the example of FIGS. 10 and 11.

Figure 20:
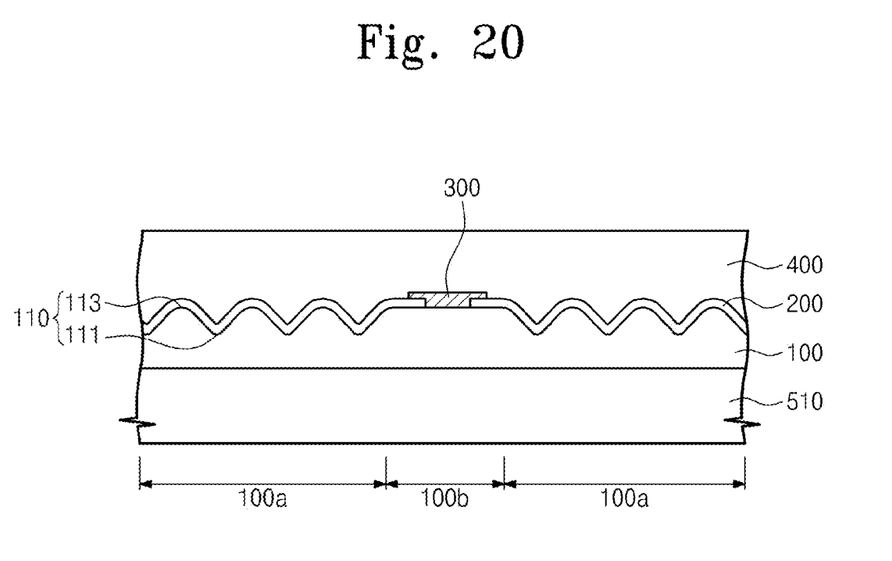

Referring to FIG. 20, a capping layer 400 may be formed on the substrate 100. The substrate 100 is coated with PDMS and the capping layer 400 may then be formed by solidifying PDMS.

Referring again to FIG. 2, the substrate 100 may be separated from the mother substrate 510. As a result, the electronic circuit 1 may be completed.

Patterning according to a pre-strain method may be difficult to control a position, an area, and a shape in which a pattern is formed. A substrate 100 having the curved interconnection region 100a and the flat device region 100b may be difficult to be prepared by the pre-strain method. The method of fabricating the electronic circuit 1 according to the present invention may easily control areas and positions of the interconnection region 100a and the device region 100b. The uneven portion 110 may be prepared to have a desired structure and/or a desired shape. For example, the uneven portion 110 having a wavy shape may be prepared by controlling an amplitude, a period, and/or directionality. According to the method of fabricating the electronic circuit 1 of the present invention, the electronic circuit 1 may be fabricated in a large area and may have improved reliability.

An electronic circuit according to an embodiment of the present invention may include a substrate having a flat device region and a curved interconnection region. An uneven portion may be provided in the interconnection region. An electronic device may be provided in the device region and a conductive line may be provided in the interconnection region. The uneven portion and the conductive line may have a wavy shape. An external force applied to the electronic circuit may be absorbed by the interconnection region of the substrate and the conductive line. The electronic device may not be affected by the external force. Therefore, functions of the electronic circuit may be maintained.

A method of fabricating an electronic circuit according to the present invention may easily adjust areas and positions of the interconnection region and the device region. Also, a structure and a shape of the uneven portion in the interconnection region may be controlled. That is, an amplitude, a period, and/or directionality of the wavy shape of the uneven portion may be controlled. The method of fabricating an electronic circuit of the present invention may be applied to large-area devices and may improve reliability.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, the preferred embodiments should be considered in descriptive sense only and not for purposes of limitation.

What is claimed is:

1. A method of fabricating an electronic circuit using a mother substrate, comprising:
   providing a substrate including an interconnection region and a device region;
   forming a conductive line on an upper surface of the substrate in the interconnection region and forming an electronic device on the upper surface of the substrate in the device region; and
   forming a capping layer on the substrate,
   wherein the interconnection region has an uneven portion,
   wherein the device region is flat,
   wherein the electronic device and the conductive line are embedded between the substrate and the capping layer,
   wherein the electronic device and the conductive line are in contact with each other horizontally, and
   wherein the providing of the substrate comprises:
      providing the mother substrate coated with a photoresist layer including a first region and a second region;
      forming a wavy pattern in the first region by using a grayscale photomask;
      coating the photoresist layer with an elastic polymer; and
      forming the substrate by separating the elastic polymer from the mother substrate and the photoresist layer.

2. The method of claim 1, wherein the first region has a position corresponding to the interconnection region of the substrate and has an inverted structure with respect to a structure of the interconnection region of the substrate; and
   wherein the second region has a position corresponding to the device region of the substrate and has an inverted structure with respect to a structure of the device region of the substrate.

3. The method of claim 1, wherein the interconnection region has a wavy surface, and
   wherein the conductive wire curves along the wavy surface.

4. The method of claim 3, wherein a wave of the wavy surface propagates in an irregular direction.

5. The method of claim 1, wherein the elastic polymer material is a first elastic polymer material, and
   wherein the capping layer includes a second elastic polymer material.

6. A method of fabricating an electronic circuit using a mother substrate, comprising:
   providing a substrate including an interconnection region and a device region;
   forming a conductive line on an upper surface of the substrate in the interconnection region and forming an electronic device on the upper surface of the substrate in the device region; and
   forming a capping layer on the substrate,
   wherein the interconnection region has an uneven portion,
   wherein the device region is flat,
   wherein the electronic device and the conductive line are embedded between the substrate and the capping layer,
   wherein the electronic device and the conductive line are in contact with each other horizontally, and
   wherein the providing of the substrate comprises:
      coating the mother substrate with an elastic polymer including a photoinitiator to form the substrate; and
      forming the uneven portion by using a grayscale photomask.

7. The method of claim 6, further comprising separating the substrate from the mother substrate, after forming the capping layer.

8. The method of claim 6, wherein forming the uneven portion comprises forming a wavy curve in the interconnection region by patterning the substrate.

9. A method of fabricating an electronic circuit using a mother substrate, comprising:
   providing a substrate including an interconnection region and a device region;
   forming a conductive line on an upper surface of the substrate in the interconnection region and forming an electronic device on the upper surface of the substrate in the device region; and
   forming a capping layer on the substrate,
   wherein the interconnection region has an uneven portion,
   wherein the device region is flat,
   wherein the electronic device and the conductive line are embedded between the substrate and the capping layer,
   wherein the electronic device and the conductive line are in contact with each other horizontally, and
   wherein the providing of the substrate comprises:
      forming a photoresist layer including a first region and a second region on the mother substrate;
      forming a square pattern in the first region;
      forming a round pattern by reflowing the photoresist layer;
      coating the photoresist layer with an elastic polymer; and
      forming the substrate by separating the elastic polymer from the mother substrate and the photoresist layer.

10. The method of claim 9, wherein forming the round pattern comprises forming a pattern having a structure inverted with respect to a structure of the uneven portion.

11. A method of fabricating an electronic circuit using a mother substrate, comprising:
   providing a substrate including an interconnection region and a device region;
   forming a conductive line in the interconnection region and forming an electronic device in the device region; and
   forming a capping layer on the substrate,
   wherein the interconnection region has an uneven portion,
   wherein the device region is flat, and
   wherein the providing of the substrate comprises:
      coating the mother substrate with an elastic polymer including a photoinitiator to form the substrate; and
      forming the uneven portion by using a grayscale photomask.

12. The method of claim 11, further comprising separating the substrate from the mother substrate, after forming the capping layer.

13. The method of claim 11, wherein forming the uneven portion comprises forming a wavy curve in the interconnection region by patterning the substrate.

14. A method of fabricating an electronic circuit using a mother substrate, comprising:
   providing a substrate including an interconnection region and a device region;
   forming a conductive line in the interconnection region and forming an electronic device in the device region; and
   forming a capping layer on the substrate,
   wherein the interconnection region has an uneven portion,
   wherein the device region is flat, wherein the electronic device and the conductive line are embedded between the substrate and the capping layer, and wherein the providing of the substrate comprises:

forming a photoresist layer including a first region and a second region on the mother substrate;

forming a square pattern in the first region;

forming a round pattern by reflowing the photoresist layer;

coating the photoresist layer with an elastic polymer; and forming the substrate by separating the elastic polymer from the mother substrate and the photoresist layer.

15. The method of claim 14, wherein forming the round pattern comprises forming a pattern having a structure inverted with respect to a structure of the uneven portion.

* * * * *